(12) United States Patent
Zhu

(10) Patent No.: US 11,357,124 B2
(45) Date of Patent: Jun. 7, 2022

(54) FLEXIBLE COVER BOARD, MANUFACTURING METHOD THEREOF, AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Chao Zhu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 303 days.

(21) Appl. No.: 16/755,728

(22) PCT Filed: Jan. 13, 2020

(86) PCT No.: PCT/CN2020/071738
§ 371 (c)(1),
(2) Date: Apr. 13, 2020

(87) PCT Pub. No.: WO2021/031525
PCT Pub. Date: Feb. 25, 2021

(65) Prior Publication Data
US 2021/0410309 A1 Dec. 30, 2021

(30) Foreign Application Priority Data
Aug. 16, 2019 (CN) .......................... 201910758280.5

(51) Int. Cl.
*H05K 5/03* (2006.01)
*H01L 51/52* (2006.01)
(Continued)

(52) U.S. Cl.
CPC .............. *H05K 5/03* (2013.01); *H01L 51/524* (2013.01); *H01L 27/3244* (2013.01); *H05K 5/0017* (2013.01)

(58) Field of Classification Search
CPC ...... H05K 5/03; H05K 5/0017; H01L 51/524; H01L 27/3244; H01L 51/5253;
(Continued)

(56) References Cited
U.S. PATENT DOCUMENTS
2016/0155967 A1 6/2016 Lee et al.

FOREIGN PATENT DOCUMENTS
CN 206312943 U 7/2017
CN 107003789 A 8/2017
(Continued)

*Primary Examiner* — Nathan L Van Sell
(74) *Attorney, Agent, or Firm* — Osha Bergman Watanabe & Burton LLP (57) ABSTRACT

A flexible cover board, a manufacturing method thereof, and a display device are provided. The flexible cover board includes a flexible substrate, a buffer layer, a first hardened layer, an organic layer, and a second hardened layer. The buffer layer is disposed on a side surface of the flexible substrate, and at least one through-hole penetrating the buffer layer is filled with a nanomaterial. The first hardened layer, the organic layer, and the second hardened layer stacked in sequence are disposed on a side surface of the buffer layer away from the flexible substrate.

20 Claims, 4 Drawing Sheets

(51) Int. Cl.
*H01L 27/32* (2006.01)
*H05K 5/00* (2006.01)

(58) Field of Classification Search
CPC ............. H01L 2251/5338; H01L 27/32; H01L 27/3223; G06F 1/1607; G06F 2200/1634; G06F 1/1643; G06F 1/1652
See application file for complete search history.

(56) References Cited

FOREIGN PATENT DOCUMENTS

| | | | |
|---|---|---|---|
| CN | 108615821 | A | 10/2018 |
| CN | 109036119 | A | 12/2018 |
| CN | 109776840 | A | 5/2019 |
| CN | 109870748 | A | 6/2019 |
| CN | 109940948 | A | 6/2019 |
| CN | 110571251 | A | 12/2019 |

FLEXIBLE COVER BOARD, MANUFACTURING METHOD THEREOF, AND DISPLAY DEVICE

The present disclosure claims priority to china application No. 201910758280.5 entitled "flexible cover board, manufacturing method thereof, and display device" filed to China National Intellectual Property Administration (CNIPA) on Aug. 16, 2019, the entire contents of which are incorporated by reference herein.

FIELD OF INVENTION

The present disclosure relates to the field of display technology, and specifically, to a flexible cover board, a manufacturing method thereof, and a display device.

BACKGROUND OF INVENTION

In recent years, with the rapid development of display technology, active-matrix organic light-emitting diode (AMOLED) flexible display greatly attracts people's concern. Flexible panels with folding properties have become the trend of development of smart phones in the future.

Technical Problems

In conventional technology, glass cover boards are generally used to be disposed on display panels of display devices. Although glass is material with desirable mechanical properties, the glass is easily broken under external impacts, and the rigid glass is unbendable.

SUMMARY OF INVENTION

Embodiments of the present disclosure provides a flexible cover board, a manufacturing method thereof, and a display device, which realize bending properties and effectively improve performance of scratch resistance and impact resistance of flexible cover boards, thereby increasing service lifespans of display devices.

In order to solve above-mentioned problems, in first aspect, the present disclosure provides a flexible cover board including a flexible substrate, a buffer layer, a first hardened layer, an organic layer, and a second hardened layer;

wherein the buffer layer is disposed on a side surface of the flexible substrate, and at least one through-hole penetrating the buffer layer is filled with a nanomaterial; and wherein the first hardened layer, the organic layer, and the second hardened layer stacked in sequence are disposed on a side surface of the buffer layer away from the flexible substrate.

According to some embodiments of the present disclosure, material of the flexible substrate is colorless polyimide.

According to some embodiments of the present disclosure, material of the buffer layer is acrylic.

According to some embodiments of the present disclosure, the nanomaterial is at least one of nano plant fiber material, nano foam material, nano silica gel material, and nano rubber material.

According to some embodiments of the present disclosure, material of the first hardened layer is an inorganic material.

According to some embodiments of the present disclosure, a thickness of the buffer layer ranges from 10 to 50 µm.

According to some embodiments of the present disclosure, a diameter of each of the at least one through-hole ranges from 5 to 30 µm.

According to some embodiments of the present disclosure, when the at least one through-hole includes a plurality of through-holes, a distance between two of the through-holes adjacent to each other ranges from 10 to 50 µm.

In second aspect, the present disclosure provides a display device including a flexible substrate, a light-emitting film layer, a thin-film encapsulation layer, a flexible touch layer, a polarizing sheet, and a flexible cover board. The flexible cover board includes a flexible substrate, a buffer layer, a first hardened layer, an organic layer, and a second hardened layer;

wherein the buffer layer is disposed on a side surface of the flexible substrate, and at least one through-hole penetrating the buffer layer is filled with a nanomaterial; and wherein the first hardened layer, the organic layer, and the second hardened layer stacked in sequence are disposed on a side surface of the buffer layer away from the flexible substrate.

According to some embodiments of the present disclosure, material of the flexible substrate is colorless polyimide.

According to some embodiments of the present disclosure, material of the buffer layer is acrylic.

According to some embodiments of the present disclosure, the nanomaterial is at least one of nano plant fiber material, nano foam material, nano silica gel material, and nano rubber material.

According to some embodiments of the present disclosure, material of the first hardened layer is an inorganic material.

According to some embodiments of the present disclosure, a thickness of the buffer layer ranges from 10 to 50 µm.

According to some embodiments of the present disclosure, a diameter of each of the at least one through-hole ranges from 5 to 30 µm.

According to some embodiments of the present disclosure, when the at least one through-hole includes a plurality of through-holes, a distance between two of the through-holes adjacent to each other ranges from 10 to 50 µm.

In third aspect, the present disclosure further provides a manufacturing method of a flexible cover board including following steps:

manufacturing a buffer layer on a surface of a flexible substrate;

manufacturing at least one through-hole within the buffer layer;

filling with a nanomaterial in the at least one through-hole;

manufacturing a first hardened layer on a surface of the buffer layer;

manufacturing an organic layer on a surface of the first hardened layer; and manufacturing a second hardened layer on a surface of the organic layer.

According to some embodiments of the present disclosure, the manufacturing of the buffer layer on the surface of the flexible substrate includes step of: printing a first ink on the flexible substrate to form the buffer layer by means of inkjet printing.

According to some embodiments of the present disclosure, the manufacturing of the at least one through-hole within the buffer layer includes step of: manufacturing at least one through-hole within the buffer layer by means of dry etching.

According to some embodiments of the present disclosure, the manufacturing of the first hardened layer on the surface of the buffer layer includes step of: depositing an inorganic material layer on the surface of the buffer layer to form the first hardened layer by means of chemical vapor deposition.

Advantageous Effects

In comparison with conventional technology, the embodiments of the present disclosure realize bending properties and effectively improve performance of scratch resistance and impact resistance of the flexible cover boards by disposing the buffer layer and the first hardened layer in a structure of the flexible cover board, wherein at least one through-hole within the buffer layer is filled with the nano-material to decrease stresses caused by impacts of rigid objects, and the first hardened layer may ensure structural strength to prevent surface scratches and prevent other film layers from being too soft and causing the reduced strength, thereby advancing performance and service lifespans of display devices.

DESCRIPTION OF DRAWINGS

In order to clearly illustrate technical solutions in embodiments of the present disclosure, the drawings required for using in the description of the embodiments is briefly described below. Obviously, the drawings in the following description are only some of the embodiments of the present disclosure. For those skilled in the art, other drawings may also be obtained in accordance with these drawings without making for creative efforts.

DETAILED DESCRIPTION OF PREFERRED EMBODIMENTS

In combination with accompanying drawings in embodiments of the present disclosure below, technical solutions in the embodiments of the present disclosure are clearly and completely described. Obviously, the described embodiments are only a part of the embodiments of the present disclosure rather than all of the embodiments. Based on the embodiments in the present disclosure, all of other embodiments obtained by those skilled in the art without making for creative efforts belong to scope protected by the present disclosure.

In the description of the present disclosure, it should be understood that indicative directions or position relations, such as terms "center", "longitudinal", "transverse", "length", "width", "thickness", "upper", "lower", "front", "back", "left", "right", "vertical", "horizontal", "top", "bottom", "inner", "inner", "outer", "clockwise", "counterclockwise", are based on directions or position relations indicated by the accompanying drawings. The indicative directions or position relations are only for convenience of describing the present disclosure and simplifying the description, and do not indicate or imply that indicated devices or elements must have a specific orientation and be constructed and operated in a specific orientation. Therefore, the indicative directions or position relations cannot be understood to be limitation to the present disclosure. In addition, terms, such as "first" and "second", are only used for purposes of description, and do not be understood to indicate or imply relative importance or to imply numbers of indicated technical features. Thus, the features defined with "first" and "second" may explicitly or implicitly include one or more of the features. In the description of the present disclosure, term "a plurality of" means two or more than two, unless specified otherwise.

In the description of the present disclosure, it should be noted that unless specified or limited otherwise, terms "mounted", "linked", and "connected" are understood broadly, and may be, for example, fixed connection, detachable connection or integral connection; may be mechanical connection or electrical connection or may communicate with each other; may be direct connection or indirect connection via intermediate media; may be inner communication of two elements or interaction between two elements. For those of ordinary skill in the art, the specific meaning of the above-mentioned terms may be understood according to specific situations.

In the present disclosure, unless specified or limited otherwise, a structure in which a first feature is "on" or "below" a second feature may include direct contact between the first feature and the second feature, and may also include indirect contact between the first feature and the second feature via additional features formed therebetween. Moreover, a structure in which the first feature "on," "above," or "on top of" the second feature may include a structure in which the first feature is directly or obliquely above the second feature, or merely means that a height of the first feature is higher than a height of the second feature, and a structure in which the first feature "below," "under," or "on bottom of" the second feature may include a structure in which the first feature is directly or obliquely under the second feature, or merely means that a height of the first feature is lower than a height of the second feature.

Various embodiments and examples are provided in the following disclosure to realize different structures of the present disclosure. In order to simplify the present disclosure, components and settings of the particular examples are described below. However, these components and settings are only by way of example, and are not intended to limit the present disclosure. In addition, reference numerals may be repeated in different examples in the present disclosure. This repeating is for the purposes of simplification and clarity, and does not refer to relations between various embodiments and/or settings. Furthermore, examples of various particular processes and materials are provided in the present disclosure, but those of ordinary skill in the art may appreciate applications of other processes and/or use of materials.

In order to realize bendability of cover boards, the desirable cover boards require certain surface strength and bendability. However, in the conventional technology, unlike glass, the flexible cover boards with the bendability generally cannot withstand stresses and protect internal structures, so structures of panels are subjected to damage, once rigid objects fall on the panels, thus causing poor display of display devices.

Based on above-mentioned description, the embodiments of the present disclosure provide a flexible cover board, a manufacturing method thereof, and a display device, which are described in detail below respectively.

First, the embodiments of the present disclosure provide a flexible cover board including a flexible substrate, a buffer layer, a first hardened layer, an organic layer, and a second hardened layer. The buffer layer is disposed on a side surface of the flexible substrate, and at least one through-hole penetrating the buffer layer is filled with a nanomaterial. The first hardened layer, the organic layer, and the second hardened layer stacked in sequence are disposed on a side surface of the buffer layer away from the flexible substrate.

Figure 1:
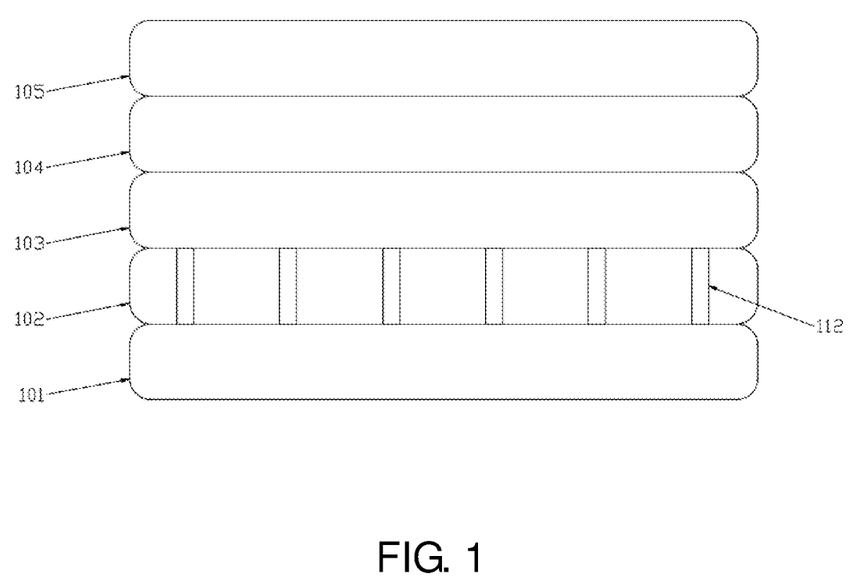
FIG. 1 is a structural schematic view of an embodiment of a flexible cover board in embodiments of the present disclosure.

As shown in FIG. 1 which is a structural schematic view of an embodiment of the flexible cover board in the embodiments of the present disclosure, the flexible cover board includes a flexible substrate 101, a buffer layer 102, a first hardened layer 103, an organic layer 104, and a second hardened layer 105. The buffer layer 102 is disposed on a side surface of the flexible substrate 101, and at least one through-hole 112 penetrating the buffer layer 102 is filled with a nanomaterial. The first hardened layer 103, the organic layer 104, and the second hardened layer 105 stacked in sequence are disposed on a side surface of the buffer layer 102 away from the flexible substrate 101.

The embodiments of the present disclosure realize bending properties and effectively improve performance of scratch resistance and impact resistance of the flexible cover boards by disposing the buffer layer 102 and the first hardened layer 103 in a structure of the flexible cover board, wherein at least one through-hole 112 within the buffer layer 102 is filled with the nanomaterial to decrease stresses caused by impacts of rigid objects, and the first hardened layer 103 may ensure structural strength to prevent surface scratches and prevent other film layers from being too soft and causing the reduced strength, thereby advancing performance and service lifespans of the display devices.

In the flexible cover board, the flexible substrate 101 requires not only desirable heat resistance performance and mechanical properties, but also desirable optical characteristics. In the embodiments of the present disclosure, material of the flexible substrate 101 is colorless polyimide (CPI), which has an effect of supporting other film layers and realizes transmittance, which is equal to or greater than 90%. Thickness of the flexible substrate 101 preferably ranges from 5 to 30 μm, more preferably from 10 to 20 μm, and most preferably 15 μm.

Similarly, the buffer layer 102 requires desirable transmittance. In the embodiments of the present disclosure, material of the buffer layer 102 is acrylic (i.e., propenoic acid plastics), also called plexiglass, which has desirable transmittance, chemical stability, and weather resistance. Thickness of the buffer layer 102 preferably ranges from 10 to 50 μm, more preferably from 20 to 35 μm, and most preferably 25 μm.

In order to enhance a buffer characteristic of the buffer layer 102, the buffer layer 102 is further optimized. In the embodiments of the present disclosure, the buffer layer 102 is directly doped with the nanomaterial with the buffer characteristic, or a structure with the buffer characteristic is disposed in the buffer layer 102. In some embodiments of the present disclosure, at least one through-hole 112 penetrates the buffer layer 102, and is filled with the nanomaterial. In some embodiments of the present disclosure, the surface of the buffer layer 102 is provided with at least one protrusion structure which is filled with the nanometer. In these cases, the nanomaterial is at least one of nano plant fiber material, nano foam material, nano silica gel material, and nano rubber material. The doped material or the provided structure may have a buffer effect of absorbing and dispersing stresses upon being impacted by an external force.

Figure 2:
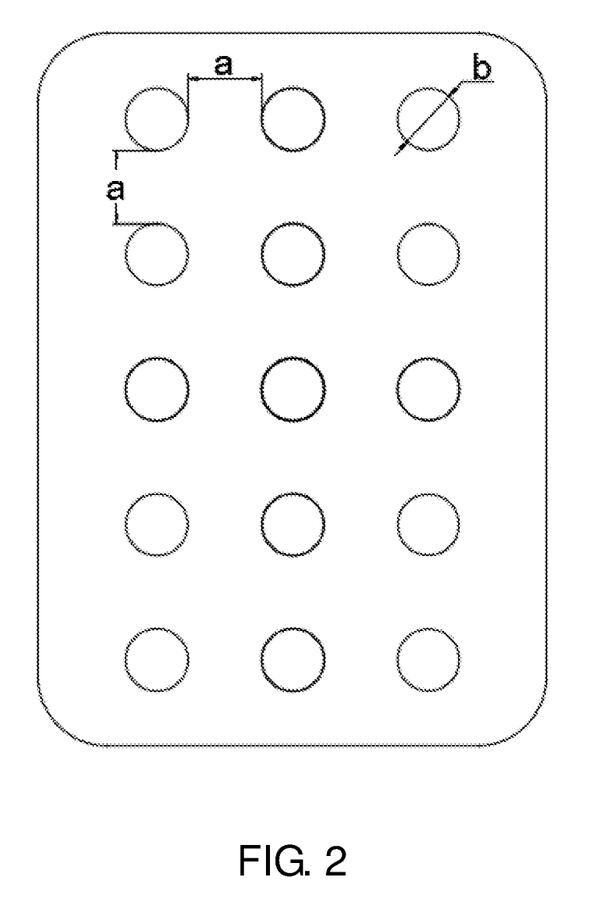
FIG. 2 is a schematic top view of an embodiment of a buffer layer in embodiments of the present disclosure.

As shown in FIG. 2 which is a schematic top view of an embodiment of the buffer layer in the embodiments of the present disclosure, a diameter of each of the at least one through-hole 112 is "b" which preferably ranges from 5 to 30 μm, more preferably from 10 to 20 μm, and most preferably 15 μm. When the at least one through-hole 112 includes a plurality of through-holes, a distance between two of the through-holes adjacent to each other is "a" which preferably ranges from 10 to 50 μm, more preferably from 15 to 30 μm, and most preferably 20 μm.

Based on the above-mentioned embodiments, in the embodiments of the present disclosure, material of the first hardened layer 103 is an inorganic material. The inorganic material including, but not limited to, SiNx, ZnS—$SiO_2$, AlNx, GeNx, TiNx, TaOx, or YOx has an effect of ensuring the structural strength to prevent the surface scratches and prevent other film layers from being too soft and causing the reduced strength. Thickness of the first hardened layer 103 preferably ranges from 0.1 to 5 μm, more preferably from 0.5 to 2 μm, and most preferably 1 μm.

In the embodiments of the present disclosure, material of the organic layer 104 is an organic material. The organic material including, but not limited to, polyethylene terephthalate, polycarbonate, cellulose triacetate, polymethyl methacrylate, methyl methacrylate-styrene copolymer, polystyrene, cycloolefin copolymer, polyethylene, or polyvinyl chloride ensures that the cover board have bending properties. Thickness of the organic layer 104 is preferably ranges from 1 to 20 μm, more preferably from 5 to 15 μm, and most preferably 8 μm.

In the embodiments of the present disclosure, material of the second hardened layer 105 is an inorganic material. The inorganic material including, but not limited to, SiNx, ZnS—$SiO_2$, AlNx, GeNx, TiNx, TaOx, or YOx has an effect of ensuring the structural strength to prevent the surface scratches and prevent other film layers from being too soft and causing the reduced strength. Thickness of the second hardened layer 105 preferably ranges from 1 to 20 μm, more preferably from 2 to 10 μm, and most preferably 5 μm.

In order to implement the flexible cover board in the embodiments of the present disclosure, on a basis of the flexible cover board, the present disclosure further provides a display device. The display device includes a flexible substrate, a light-emitting film layer, a thin-film encapsulation layer, a flexible touch layer, a polarizing sheet, and the flexible cover board as described in the above-mentioned embodiments, which are stacked from bottom to top in sequence.

Figure 3:
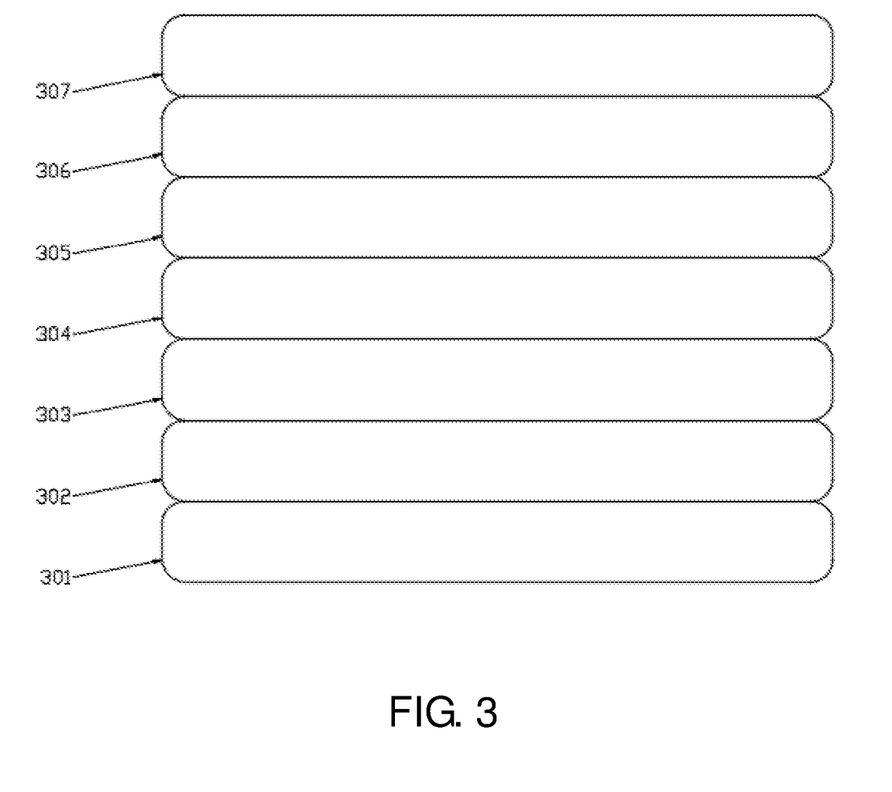
FIG. 3 is a structural schematic view of an embodiment of a display device in embodiments of the present disclosure.

As shown in FIG. 3 which is a structural schematic view of an embodiment of the display device in the embodiments of the present disclosure. The display device includes a flexible substrate 301, an array substrate 302, a light-emitting film layer 303, a thin-film encapsulation layer 304, a flexible touch layer 305, a polarizing sheet 306, and a flexible cover board 307 which are stacked from bottom to top in sequence.

The array substrate 302 is a low temperature poly-silicon (LTPS) flexible array substrate. The light-emitting film layer 303 is an electro luminescent (EL) light-emitting film layer.

The performance and the service lifespan of the display device are further improved by employing the flexible cover board as described in the above-mentioned embodiments.

Figure 4:
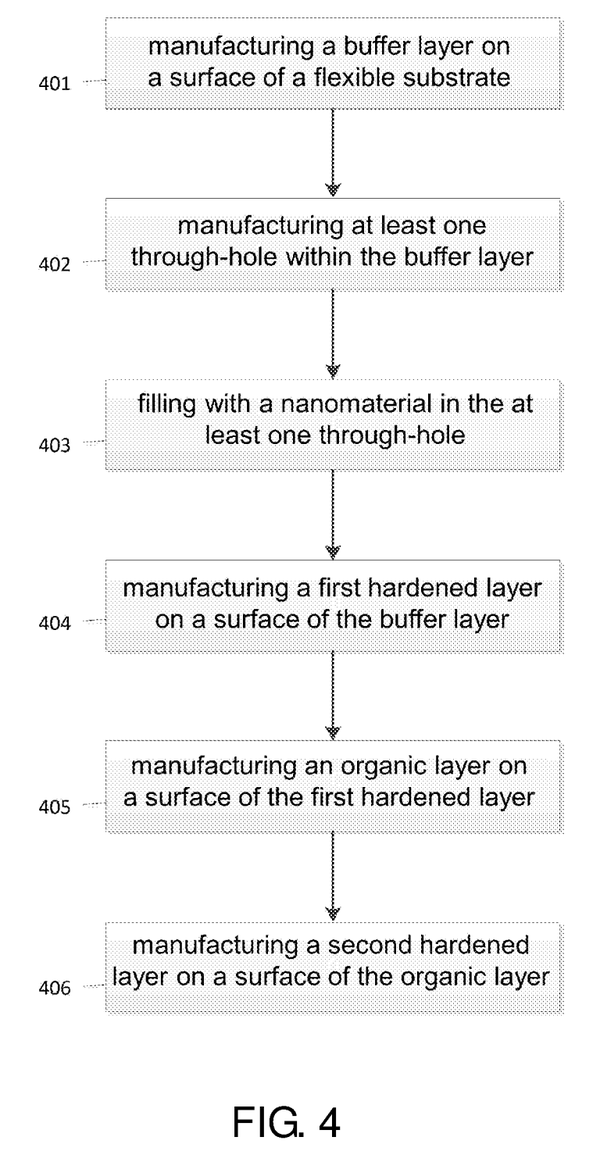
FIG. 4 is a schematic flow chart of a manufacturing method of the flexible cover board in embodiments of the present disclosure.

Based on the above-mentioned flexible cover board, as shown in FIG. 4 which is a schematic flow chart of a manufacturing method of the flexible cover board in the embodiments of the present disclosure, the present disclosure further provides a manufacturing method of the flexible cover board. The manufacturing method of the flexible cover board in the embodiments of the present disclosure includes following steps:

Step 401: The buffer layer is manufactured on the surface of the flexible substrate.

Specifically, in the embodiments of the present disclosure, a first ink is printed on the flexible substrate to form the buffer layer by means of inkjet printing. The material of the flexible substrate is CPI, and the thickness of the flexible substrate ranges from 5 to 30 μm. The material of the buffer layer is acrylic, and the thickness of the buffer layer ranges from 10 to 50 μm.

Step 402: At least one through-hole is manufactured within the buffer layer.

Specifically, in the embodiments of the present disclosure, at least one through-hole is manufactured within the buffer layer by means of dry etching. The diameter of each of the at least one through-hole ranges from 5 to 30 μm. When the at least one through-hole includes a plurality of through-holes, the distance between two of the through-holes adjacent to each other ranges from 10 to 50 μm.

Step 403: The at least one through-hole is filled with the nanomaterial.

Specifically, in the embodiments of the present disclosure, the nanomaterial is at least one of nano plant fiber material, nano foam material, nano silica gel material, and nano rubber material.

Step 404: The first hardened layer is manufactured on the surface of the buffer layer.

Specifically, in the embodiments of the present disclosure, an inorganic material layer is deposited on the surface of the buffer layer to form the first hardened layer by means of chemical vapor deposition (CVD). The thickness of the first hardened layer ranges from 0.1 to 5 μm.

Step 405: The organic layer is manufactured on a surface of the first hardened layer.

Specifically, in the embodiments of the present disclosure, a second ink is printed on the surface of the first hardened layer to form the organic layer by means of inkjet printing. The material of the organic layer is an organic material, and the thickness of the organic layer ranges from 1 to 20 μm.

Step 406: The second hardened layer is manufactured on a surface of the organic layer.

Specifically, in the embodiments of the present disclosure, an inorganic material layer is coated on the surface of the organic layer to form the second hardened layer. The thickness of the second hardened layer ranges from 1 to 20 μm.

In the above-mentioned embodiments, the description of each embodiment has its own emphasis. A part which is not described in detail in an embodiment may refer to related descriptions in other embodiments.

The embodiments of the present disclosure have been described in detail above. Specific examples are used in the specification to describe the principle and implementation manners of the present disclosure. The description of the foregoing embodiments is merely intended to facilitate understanding technical solutions and core idea of the present disclosure. Those of ordinary skill in the art should understand that the technical solutions described in the foregoing embodiments can still be modified, or some of technical features can be replaced equivalently. However, those modifications and replacements do not make essence of the corresponding technical solutions depart from scope of the technical solutions of various embodiments of the present disclosure.

What is claimed is:

1. A flexible cover board, comprising: a flexible substrate, a buffer layer, a first hardened layer, an organic layer, and a second hardened layer;
   wherein the buffer layer is disposed on a side surface of the flexible substrate, and at least one through-hole penetrating the buffer layer is filled with a nanomaterial; and
   wherein the first hardened layer, the organic layer, and the second hardened layer stacked in sequence are disposed on a side surface of the buffer layer away from the flexible substrate.

2. The flexible cover board according to claim 1, wherein material of the flexible substrate is colorless polyimide.

3. The flexible cover board according to claim 1, wherein material of the buffer layer is acrylic.

4. The flexible cover board according to claim 1, wherein the nanomaterial is at least one of nano plant fiber material, nano foam material, nano silica gel material, and nano rubber material.

5. The flexible cover board according to claim 1, wherein material of the first hardened layer is an inorganic material.

6. The flexible cover board according to claim 1, wherein a thickness of the buffer layer ranges from 10 to 50 μm.

7. The flexible cover board according to claim 1, wherein a diameter of each of the at least one through-hole ranges from 5 to 30 μm.

8. The flexible cover board according to claim 1, wherein when the at least one through-hole includes a plurality of through-holes, a distance between two of the through-holes adjacent to each other ranges from 10 to 50 μm.

9. A display device, comprising: a flexible cover including a flexible substrate, a buffer layer, a first hardened layer, an organic layer, and a second hardened layer;
   wherein the buffer layer is disposed on a side surface of the flexible substrate, and at least one through-hole penetrating the buffer layer is filled with a nanomaterial; and
   wherein the first hardened layer, the organic layer, and the second hardened layer stacked in sequence are disposed on a side surface of the buffer layer away from the flexible substrate.

10. The display device according to claim 9, wherein material of the flexible substrate is colorless polyimide.

11. The display device according to claim 9, wherein material of the buffer layer is acrylic.

12. The display device according to claim 9, wherein the nanomaterial is at least one of nano plant fiber material, nano foam material, nano silica gel material, and nano rubber material.

13. The display device according to claim 9, wherein material of the first hardened layer is an inorganic material.

14. The display device according to claim 9, wherein a thickness of the buffer layer ranges from 10 to 50 μm.

15. The display device according to claim 9, wherein a diameter of each of the at least one through-hole ranges from 5 to 30 μm.

16. The display device according to claim 9, wherein when the at least one through-hole includes a plurality of through-holes, a distance between two of the through-holes adjacent to each other ranges from 10 to 50 μm.

17. A manufacturing method of a flexible cover board, comprising steps of:

manufacturing a buffer layer on a surface of a flexible substrate;

manufacturing at least one through-hole within the buffer layer;

filling with a nanomaterial in the at least one through-hole;

manufacturing a first hardened layer on a surface of the buffer layer;

manufacturing an organic layer on a surface of the first hardened layer; and manufacturing a second hardened layer on a surface of the organic layer.

18. The manufacturing method according to claim 17, wherein the manufacturing of the buffer layer on the surface of the flexible substrate includes step of: printing a first ink on the flexible substrate to form the buffer layer by means of inkjet printing.

19. The manufacturing method according to claim 17, wherein the manufacturing of the at least one through-hole within the buffer layer includes step of: manufacturing at least one through-hole within the buffer layer by means of dry etching.

20. The manufacturing method according to claim 17, wherein the manufacturing of the first hardened layer on the surface of the buffer layer includes step of: depositing an inorganic material layer on the surface of the buffer layer to form the first hardened layer by means of chemical vapor deposition.

\* \* \* \* \*